US012046938B2

(12) United States Patent
Selby et al.

(10) Patent No.: US 12,046,938 B2
(45) Date of Patent: Jul. 23, 2024

(54) VEHICLE BATTERY CHARGING APPARATUS

(71) Applicant: Amphenol Tecvox, LLC, Madison, AL (US)

(72) Inventors: Steven F. Selby, Athens, AL (US); Tommy L. Roberts, Cullman, AL (US)

(73) Assignee: AMPHENOL TECVOX, LLC, Madison, AL (US)

( * ) Notice: Subject to any disclaimer, the term of this patent is extended or adjusted under 35 U.S.C. 154(b) by 410 days.

(21) Appl. No.: 17/446,109

(22) Filed: Aug. 26, 2021

(65) Prior Publication Data

US 2021/0391734 A1   Dec. 16, 2021
US 2022/0376528 A9   Nov. 24, 2022

Related U.S. Application Data

(63) Continuation-in-part of application No. 16/795,383, filed on Feb. 19, 2020, now Pat. No. 11,482,870.

(Continued)

(51) Int. Cl.
*H02J 7/00* (2006.01)
*H02J 50/10* (2016.01)
(Continued)

(52) U.S. Cl.
CPC .......... *H02J 7/0044* (2013.01); *H02J 7/0013* (2013.01); *H02J 50/10* (2016.02); *H02J 50/402* (2020.01);
(Continued)

(58) Field of Classification Search
CPC ............................ H02J 7/00309; H02J 7/0045
(Continued)

(56) References Cited

U.S. PATENT DOCUMENTS 10,782,752 B2   9/2020   Koo et al.
2014/0007594 A1   1/2014   Lofy
(Continued)

FOREIGN PATENT DOCUMENTS

DE   102018201300 A1   8/2019
DE   202020101166 U1   6/2021
(Continued)

OTHER PUBLICATIONS

U.S. Final Office Action; U.S. Appl. No. 16/795,383, filed Feb. 19, 2020; dated Feb. 1, 2022; 34 pages.
(Continued)

*Primary Examiner* — Edward Tso
*Assistant Examiner* — Ahmed H Omar
(74) *Attorney, Agent, or Firm* — CANTOR COLBURN LLP

(57) ABSTRACT

A battery charging apparatus for device charging in a vehicle includes a charging device compartment, a housing, a blower, a charger, and a duct. The charging device compartment is configured to retain at least one device. The housing includes a top member, a bottom member, and an accommodating space. The housing further includes an air-return port. The blower is in the housing and has an input port and an output port. The charger is in the housing and between the top member of the housing and the blower. The duct has an input port and an output port. The input port of the duct is coupled to the output port of the blower, and the output port of the duct is coupled to the air-return port of the housing. The duct forms a barrier between the accommodating space and the air-return port of the housing.

22 Claims, 7 Drawing Sheets

Related U.S. Application Data

(60) Provisional application No. 62/925,029, filed on Oct. 23, 2019.

(51) Int. Cl.
  *H02J 50/40* (2016.01)
  *H05K 1/02* (2006.01)
  *H05K 7/20* (2006.01)
  *H02J 50/00* (2016.01)
  *H02J 50/70* (2016.01)

(52) U.S. Cl.
  CPC ....... *H05K 1/0203* (2013.01); *H05K 7/20145* (2013.01); *H02J 50/005* (2020.01); *H02J 50/70* (2016.02); *H05K 2201/10098* (2013.01)

(58) Field of Classification Search
  USPC ........................................ 320/108
  See application file for complete search history.

(56) References Cited

U.S. PATENT DOCUMENTS

| | | |
|---|---|---|
| 2014/0125277 A1 | 5/2014 | Van Wiemeersch et al. |
| 2016/0087485 A1 | 3/2016 | Maeda et al. |
| 2016/0276865 A1 | 9/2016 | Pike et al. |
| 2016/0276866 A1* | 9/2016 | Lachnitt ............... H02J 50/10 |
| 2016/0344221 A1 | 11/2016 | Kramer et al. |
| 2017/0047769 A1 | 2/2017 | Kim |
| 2018/0224909 A1 | 8/2018 | Koo |
| 2019/0014683 A1 | 1/2019 | Han |
| 2020/0083726 A1 | 3/2020 | Kim et al. |
| 2021/0050741 A1 | 2/2021 | Pinkos et al. |
| 2021/0126482 A1 | 4/2021 | Selby et al. |
| 2021/0162838 A1* | 6/2021 | Thiel .................... B60H 1/24 |
| 2022/0302757 A1 | 9/2022 | Pei et al. |

FOREIGN PATENT DOCUMENTS

| | | |
|---|---|---|
| EP | 4064503 A1 | 9/2022 |
| WO | WO-2018/143515 A1 | 8/2018 |
| WO | 2019114175 A1 | 6/2019 |

OTHER PUBLICATIONS

Extended European Search Report for EP 20203291, dated Mar. 11, 2021, 8 pgs.
European Office Action for European Application No. 20203291.8; Report dated Mar. 6, 2023 (pp. 1-6).
Extended European Search Report for European Application No. 22192322.0; Report dated Jan. 30, 2023 (pp. 1-10).

\* cited by examiner

VEHICLE BATTERY CHARGING APPARATUS

CROSS-REFERENCE TO RELATED APPLICATIONS

This application is a continuation-in-part application of U.S. patent application Ser. No. 16/795,383, filed on Feb. 19, 2020, which claims the benefit of U.S. Provisional Application No. 62/925,029, filed on Oct. 23, 2019, the entire contents of all of which are relied upon and incorporated herein by reference.

FIELD

The present disclosure relates to a battery charging apparatus. More particularly, the present disclosure relates to a wireless battery charging and cooling apparatus for a vehicle.

BACKGROUND

Wireless chargers have been developed for charging batteries, and especially batteries that are used in portable devices such as smart phones. The wireless chargers typically include an enclosed charging device and a platform positioned on the outside of the charging device. The device being charged is placed on the platform, and power is wirelessly transmitted from the charging device to the battery being charged, through the battery enclosure and platform. However, those wireless chargers, as well as the battery being charged, generate a lot of heat during the charging process.

SUMMARY

An aspect of this disclosure is a battery charging apparatus for device charging in a vehicle that includes a charging device compartment, a housing, a blower, a charger, and a duct. The charging device compartment is configured to retain at least one device. The housing includes a top member, a bottom member, and an accommodating space between the top member and the bottom member. The housing further includes an air-return port. The blower is in the housing and has an input port and an output port. The charger is in the housing and between the top member of the housing and the blower. The duct has an input port and an output port. The input port of the duct is coupled to the output port of the blower. The output port of the duct is coupled to the air-return port of the housing. The duct forms a barrier between the accommodating space and the air-return port of the housing.

In one example, the battery charging apparatus further comprises a pad in the charging device compartment and has a first plurality of openings.

In another example, the first plurality of openings include slits.

In some examples, the at least one device in the car includes a phone containing a battery; and the pad is an anti-skid pad configured to support the phone in the device compartment.

In certain examples, the charging device compartment includes a tray having a second plurality of openings.

In other examples, the top member includes a third plurality of openings at one or more periphery portions of the top member.

In one example, the third plurality of openings at one or more periphery portions of the top member configured to operate as air inlet openings of the housing.

In another example, the charger is a wireless charger.

In some examples, the input port of the blower faces towards the charger.

In certain examples, the input port of the duct encloses the output port of the blower and is configured to receive air from the output port of the blower.

In other examples, the charger includes a first printed circuit board assembly (PCBA). The first PCBA includes a printed circuit board and at least one group of charge coils coupled to the first printed circuit board and configured to charge the at least one device in the vehicle.

In one example, the first printed circuit board has one or more slots penetrating the first printed circuit board.

In another example, the battery charging further comprises an antenna device between the top member of the housing and the charger. The antenna device includes a second printed circuit board assembly.

In some examples, the battery charging apparatus further comprises a first air path in the housing and configured to, in response to the blower being on, guide air to flow along a first surface of a first printed circuit board of the charger and towards the input port of the blower, the first surface facing toward the blower.

In certain examples, the battery charging apparatus further comprises a second air path in the housing and configured to, in response to the blower being on, guide air to flow along a second surface of the first printed circuit board of the charger, where the second surface of the first printed circuit board of the charger faces away from the blower; and guide air towards the input port of the blower via one or more slots penetrating the first printed circuit board of the charger.

In other examples, the battery charging apparatus further comprises an antenna device between the top member of the housing and the charger, wherein the antenna device includes a second printed circuit board; and a second air path in the housing and configured to, in response to the blower being on, guide air to flow between a second surface of the first printed circuit board of the charger and a first surface of the second printed circuit board of the antenna device, the second surface of the first printed circuit board of the charger and the first surface of the second printed circuit board of the antenna device face towards each other; and guide air towards the input port of the blower via one or more slots penetrating the first PCB of the charger.

Another aspect of this disclosure is a battery charging apparatus for device charging in a vehicle that comprises a charging device compartment, a housing, a blower, a charger, and a duct. The charging device compartment includes two portions configured to retain two devices respectively. The housing includes a top member, a bottom member, and an accommodating space between the top member and the bottom member, wherein the housing further includes an air-return port. The blower is in the housing and has an input port and an output port. The charger is in the housing and between the top member of the housing and the blower. The charger includes two groups of charge coils for charging the two devices respectively. The duct has an input port and an output port, the input port of the duct being coupled to the output port of the blower, and the output port of the duct being coupled to the air-return port of the housing. The duct forms a barrier between the accommodating space and the air-return port of the housing. The blower is configured to pull air from at least one of the two devices and from the charger and to push air away via the duct and the air-return port of the housing.

In one example, the charging device compartment includes a ridge that separates the two portions of the charging device compartment.

In another example, the battery charging apparatus of claim further comprises a first air path in the housing (340) and configured to, in response to the blower being on, guide air to flow along a first surface of a first printed circuit board of the charger and towards the input port of the blower. The first surface faces toward the blower.

Another aspect of this disclosure is a battery charging apparatus for device charging in a vehicle that comprises a pad, a charging device compartment, a housing, a blower, a wireless charger, and a duct. The pad has a first plurality of openings. The charging device compartment includes two portions configured to retain two phones respectively. The charging device compartment includes a tray having a second plurality of openings, and the pad is in the tray of the charging device compartment. A housing includes a top member, a bottom member, and an accommodating space between the top member and the bottom member. The top member of the housing includes a third plurality of openings at one or more periphery portions of the top member and the housing further includes an air-return port. The blower is in the housing and has an input port and an output port. The wireless charger is in the housing and between the top member of the housing and the blower. The charger includes two groups of charge coils for charging the two devices respectively. The duct has an input port and an output port. The input port of the duct is coupled to the output port of the blower. The output port of the duct is coupled to the air-return port of the housing. The duct forms a barrier between the accommodating space and the air-return port of the housing, and the blower is configured to pull air from at least one of the two phones and from the wireless charger and to push air away via the duct and the air-return port of the housing.

This summary is not intended to identify essential features of the claimed subject matter, nor is it intended for use in determining the scope of the claimed subject matter. It is to be understood that both the foregoing general description and the following detailed description are exemplary and are intended to provide an overview or framework to understand the nature and character of the disclosure.

BRIEF DESCRIPTION OF THE FIGURES

The accompanying drawings are incorporated in and constitute a part of this specification. It is to be understood that the drawings illustrate only some examples of the disclosure and other examples or combinations of various examples that are not specifically illustrated in the figures may still fall within the scope of this disclosure. Examples will now be described with additional detail through the use of the drawings, in which.

DETAILED DESCRIPTION

An example disclosed is a vehicle battery charging apparatus for wirelessly charging a device, the apparatus comprising a charging device compartment having a platform for retaining the device, a battery charger housing for retaining a wireless battery charger, one or more housing vents in the battery charger housing; and a blower in air communication with the battery charger housing for communicating air with the battery charger housing through the one or more housing vents to cool the wireless battery charger.

Another example disclosed is a vehicle dashboard having a dashboard housing, a battery charging device compartment built-in to the dashboard, the battery charging device having a platform for retaining a device to be charged. The dashboard also has a battery charger housing built-in to the dashboard, the battery charger housing retaining a wireless battery charger.

Figure 1:
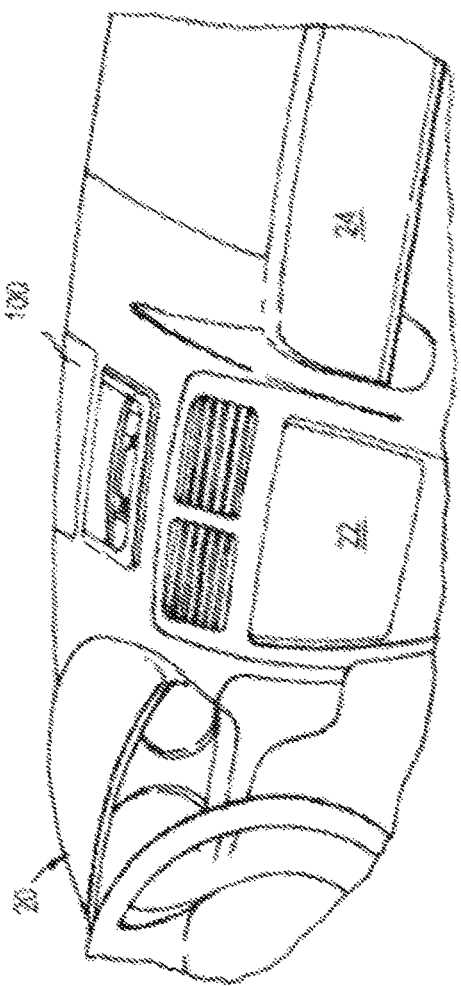
FIG. 1 is a perspective view of an interior vehicle compartment showing a battery charging apparatus built-in to the vehicle dashboard.

Turning to the drawings, FIG. 1 shows the interior of a vehicle having a dashboard 20, control panel 22, and a storage compartment such as a glove box 24. The dashboard 20 has a housing with an outer surface. The storage compartment 24 is positioned in the dashboard housing 20 at the passenger side of the vehicle and substantially flush with the dashboard housing outer surface. The control panel 22 is positioned in the dashboard housing 20 at the center of the vehicle between the driver and the passenger and substantially flush with the outer surface of the dashboard housing. The control panel 22 includes a variety of instrument controls, such as a radio, air conditioner, heater, blower, navigation unit with GPS (Global Positioning System), and rear camera.

In accordance with one example embodiment of the present disclosure, a battery charging apparatus 100 is built-in to the dashboard 20 above or below the control panel 22 and air vents of the vehicle. As shown, the battery charging apparatus 100 is positioned inside the dashboard 20 at the center of the vehicle between the passenger and the driver; though the battery charging apparatus 100 can be at any suitable position such as in the storage compartment 24 or at the rear seats or in the roof. In addition, though the battery charging apparatus 100 is shown built-in to the dashboard housing 20 and flush with the outer surface of the dashboard housing 20, it can be a separate component that is attached to the dashboard 20 or other vehicle component.

Figure 2:
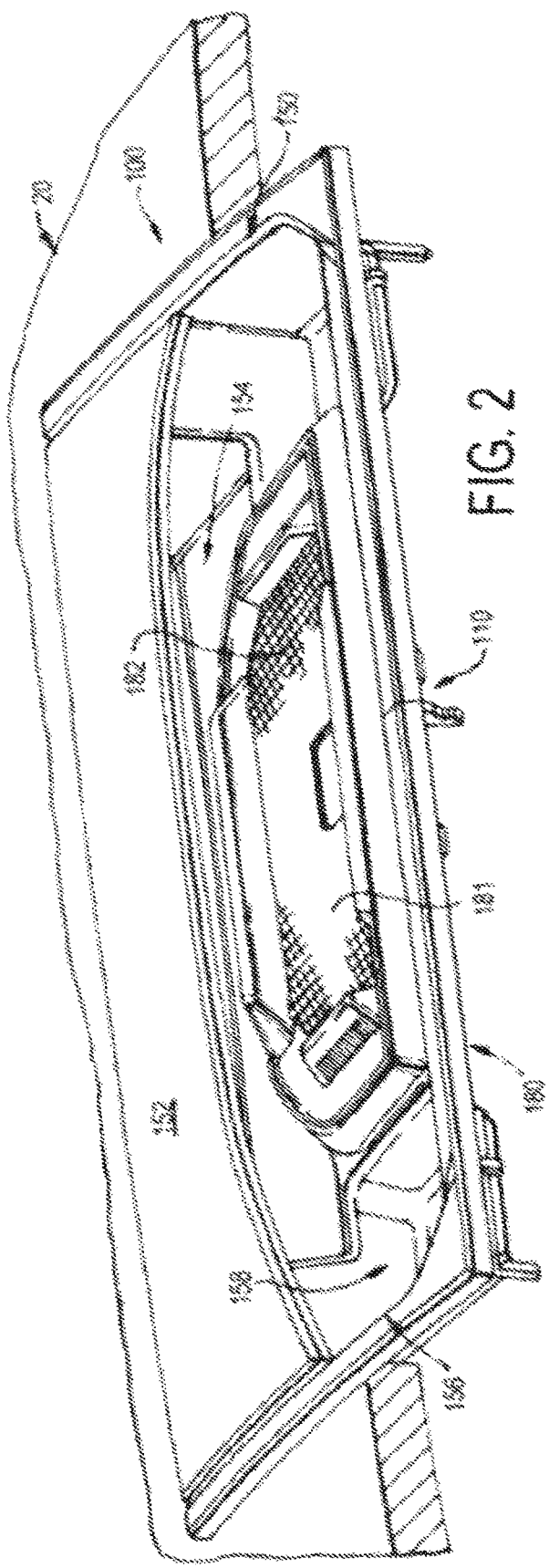
FIG. 2 is a perspective view of the battery charging apparatus of FIG. 1.
Figure 3:
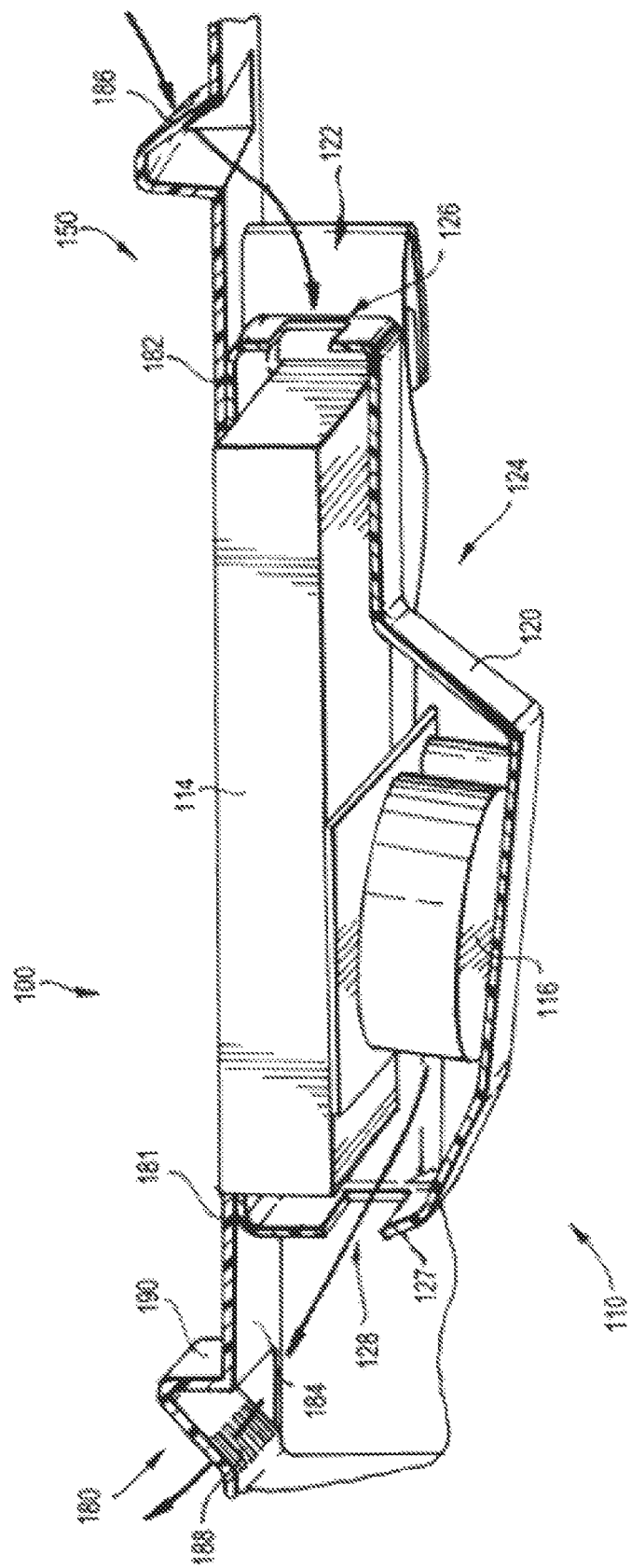
FIG. 3 is side cross-sectional view of the battery charging apparatus of FIG. 1.

FIGS. 2, 3 show the battery charging apparatus 100 in greater detail. The apparatus 100 has a charger compartment 110, a charging device compartment or storage compartment 150, and a tray 180 therebetween. The charging device compartment 150 retains the device being charged, such as a smart phone or other portable device. The charger compartment 110 encloses the power supply that provide power to device being charged. When used with a wireless charging device, the charger compartment 110 is immediately adjacent to the charging device compartment 150, so that the wireless charger is as close as possible to the battery of the device being charged. The charger compartment 110 is located beneath the charging device compartment 150, as illustrated, though other suitable arrangements can be provided such as that the compartments 110, 150 are side-by-side. The tray 180 has a central platform 181 with a top surface 182 and a bottom surface 184 opposite the top surface 182.

Battery Charger Compartment 110

Figure 5:
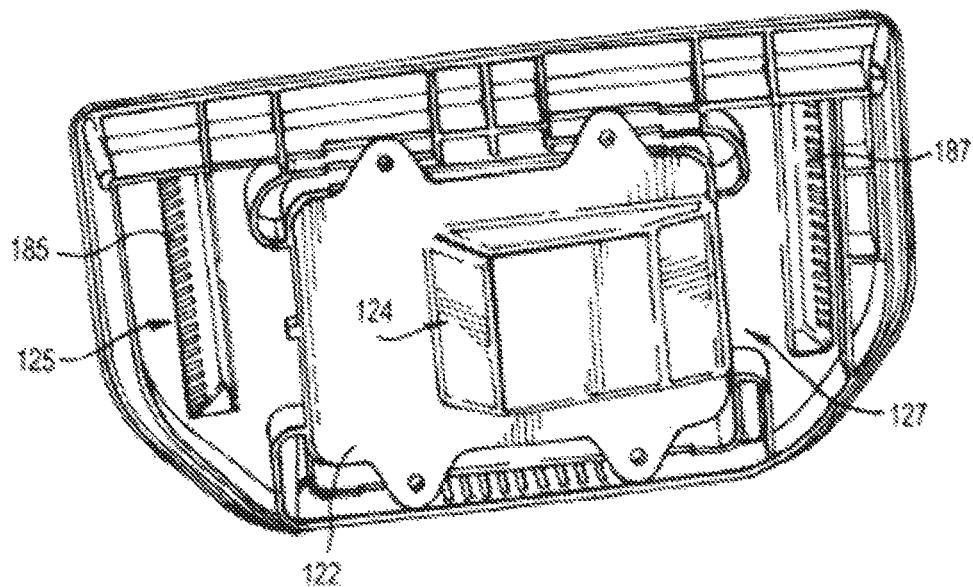
FIG. 5 is a bottom view of the battery charging apparatus.

Referring to FIGS. 3, 5, the charger compartment 110 has a housing 120, a battery charger 114, and a blower or fan 116. The battery charger 114 can be a wireless battery charger and/or a wired battery charger, and can be electrically coupled with the vehicle power supply (e.g., the vehicle battery) to generate power that is used to charge the battery being charged. As shown, the battery charger 114 has a rectangular cuboid shape with a rectangular cross-section. The battery charger 114 has a flat top surface and a flat bottom surface. The blower 116 is also electrically coupled to the vehicle power supply or the battery charger 114 to power the blower 116. A sensor or processing device is provided to turn the blower ON and OFF as needed, depending on the temperature inside the housing 120. For example, the sensor detects the temperature inside the housing 120 or the temperature of the charging device 114, and turn ON the blower 116 when the sensed temperature exceeds a threshold value. Or the processing device can control operation of the blower based on the sensed temperature and other conditions, such as the status of the battery charger 114 and the temperature on the inside of the vehicle. The processing device can be a separate component, or can be part of the vehicle control panel 22 and general HVAC (heating, ventilation, air conditioning) operation.

The housing 120 is a thin sheet that forms an airtight enclosure that houses the battery charger 114 and the blower 116. The housing 120 is made of rigid plastic and molded. The housing 120 has a battery charger housing section 122 that receives the battery charger 114, and a blower housing section 124 that receives the blower 116. The housing 120 is rectangular or square shaped, and has an intake end 125, an exhaust end 127 opposite the intake end 125, two sides, and a bottom. The top of the housing 120 is formed by the bottom surface 184 of the platform 181, or the housing 120 can have a separate top or a combination of the platform 181 and a separate partial top. Thus, the flat top surface of the battery charger 114 contacts the flat bottom surface 184 of the platform 181, or the flat bottom surface of the top of the housing 120, which in turn contacts the flat bottom surface 184 of the platform 181. Thus, the battery charger 114 is positioned as closely as possible to any device to be charged that is placed on the top surface 182 of the platform 181, to maximize the efficiency of the power transfer from the batter charger 114 to the device being charged.

The blower housing section 124 extends outward away from the battery charger 114 and battery charger housing section 122, at the bottom of the housing 120 to accommodate the added size of the blower 116 that is received therein. The battery charger housing section 122 and the blower housing section 124 together form a single integral unit defining an interior space that includes a battery charger interior space that receives the battery charger 114 and a blower interior space that receives the blower. The battery charger interior space is contiguous and in air flow communication with the battery charger interior space.

One or more intake openings or vents 126 are located at the intake end 125 of the housing 120, and one or more exhaust openings or vents 128 are located at the exhaust end 127 of the housing 120. More specifically, the vents 126, 128 are provided in the battery charger housing section 122 of the housing 120. Still further, an intake vent can be provided at the rear of the housing 120 (e.g., in the battery charger section 122). Accordingly, when the blower 116 is turned ON, it pulls air into the housing 120 through the intake vents 126, across the battery charger 114, and out through the exhaust vents 128. As the air is drawn across the battery charger 114, it is heated by the battery charger 114, which cools the battery charger 114, and the heated air is exhausted. In one example of the disclosure, the battery charger 114 is spaced apart from the platform 181 or top of the housing 120, so that air flows across the top of the battery charger 114 in the space between the platform 181 and the battery charger 114 to further cool the battery charger 114.

Charging Device Compartment 150

Figure 4:
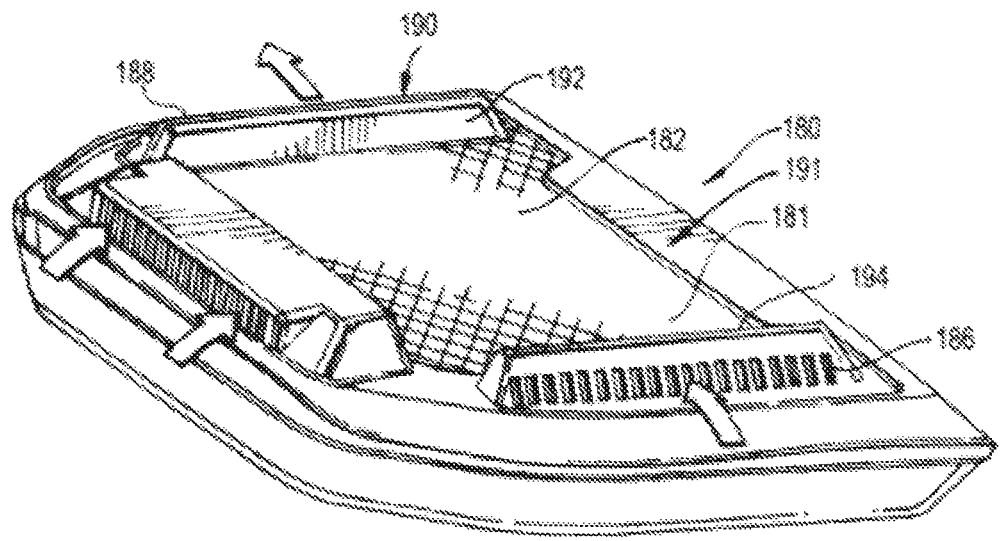
FIG. 4 is a perspective view of the tray with cooling vents.

Referring to FIGS. 2, 4, the charging device compartment 150 is shown in further detail. The compartment 150 includes the tray 180 and a protective cover or shield 152. In the example embodiment shown, the protective cover 152 extends at the top of the charging device compartment 150, and the front facing side is open to form a front opening 156 and define a protected interior space 154. Accordingly, the protective cover 152 extends over the tray 180 and creates the protected space 154 that is accessible through the front opening 156. The tray 180 is at least partly covered by the cover 152 and at least partly within the protected space 154 and accessible through the front opening 156. The cover 152 is opaque to provide protection from the sun and conform with the color scheme for the rest of the dashboard 20. The cover 152 also prevents the devices held in the tray 180 from escaping due to motion of the vehicle, and protect the devices against other objects inadvertently coming into contact with them.

The tray 180 is a flat surface. In addition, as best illustrated in the example embodiment of FIGS. 2, 4, one or more tray vents including one or more tray intake vents 186 and one or more tray exhaust vents 188, is provided in the tray 180. For example, the vents 186, 188 are provided in the platform 181 or at one or more sides of the tray 180 at the periphery of the tray 180 and about the central platform 181, including at the longitudinal sides and/or the lateral transverse sides of the tray 180 or platform 181. However, the vents 186, 188 need not be at the periphery of the tray or platform, but can be inside the periphery of the tray or platform.

Referring to FIG. 3, The vents 186, 188 allow air from the interior of the vehicle to enter the dashboard 20 and communicate with the battery charger housing section 122 in the space beneath or behind the tray 180. Thus, the blower 116 pulls cool air in through the tray intake vent 186 and through the battery charger intake vent 126, and forces heated air out through the battery charger exhaust vent 128 and the tray exhaust vent 188. In one example of the disclosure, baffles or plenums are placed on the outside of the housing 120 to direct air from the tray intake vent 186 to the storage intake vent 126, and from the storage exhaust vent 128 to the tray exhaust vent 188.

In one example, the tray 180 is a flat top surface 182 that forms a platform 181, and the tray vents 186, 188 are formed in the flat top surface 182 of the platform 181. Still further, the tray or platform vents 186, 188 optionally have baffles or fins that direct air out of the charging device compartment 150, so that the intake vent 186 pulls air from the passenger compartment through the front opening 156 and the exhaust vent 188 expels air into the passenger compartment through the front opening 156.

In another example, as shown, the tray 180 has one or more raised walls 190 positioned at the outer periphery of the platform 181 at the one or more sides of the platform 181, including at the front side, back side, left side, and right side. The walls 190 extend upward from the top surface 182 of the central platform 181. The walls 190 define a central receiving area 191 of the platform 181, and the walls 190 are formed about the sides of the platform 181. However, the walls 190 need not be at the periphery of the tray or platform, but instead are inside the periphery of the tray or platform.

In one example embodiment shown, the raised walls 190 have an inwardly-facing side 192 and an outwardly-facing side 194, and a flat or curved top therebetween, forming an elongated pyramid-like shape with a triangular cross-section. The inwardly-facing side 192 are substantially straight, or slightly angled outward, and prevents the device being charged from inadvertently falling out of the platform 181 and tray 180. The outwardly-facing side 194 are angled more sharply inward to provide a more ergonomic shape, or are substantially vertical, both of which are shown in FIG. 4. The tray vents 186, 188 need not be provided in the platform 181, but instead are formed as wall vents 186, 188 in the outwardly-facing sides 192 of the raised walls 190. Thus, the wall vents 186, 188 face outwardly away from the central platform 181 and away from any devices to be charged that are in the platform 181. Accordingly, hot air from the exhaust wall vents 188 is directed away from the tray 180 and the devices being charged. Still further, the wall vents 186, 188 have baffles or fins that direct air out of the charging device compartment 150, so that the intake vent 186 pulls air from the passenger compartment through the front opening 156 and the exhaust vent 188 expels air into the passenger compartment through the front opening 156.

In one example embodiment, the top surface 182 of the platform 181 have a rubber coating that grips the device being charged so that the device does not slide around on the tray 180 as the vehicle is in motion.

Thus, the entire battery charging apparatus 100 is formed integral with the dashboard housing 20 and substantially flush with the outer surface of the dashboard housing 20. The charging device compartment 150 is exposed at the dashboard 20 so that the user can place a device to be charged on the top surface 182 of the platform 181 of the tray 180. The charger compartment 110 is recessed inside the dashboard 20 below the charging device compartment 150. The tray 180 separates the charging device compartment 150 and the charger compartment 110. The blower 116 draws air from the interior of the vehicle into the charging device compartment 150 at the interior of the dashboard 20 to cool the battery charging device 114, and expels heated air from charging device compartment 150 out of the dashboard 20 into the interior of the vehicle. Still further, air need not be pulled in and expelled into the vehicle interior, but can be communicated from other locations, such as the exterior of the vehicle.

In addition, the charging device compartment 150 includes other features. For example, one or more side compartments or holders 158 are provided. In FIG. 1, the holders are shown on each side of the tray 180, and are smaller recessed compartments that hold miscellaneous items such as change, keys, and electronic items.

In addition, it is noted that the cover 152 is fixed and provides an opening 158 at the front of the charging device compartment 158. That opening 158 grants access to the tray 180 so that users can readily insert and remove devices to be charged. In addition, the open front allows heated air from the blower to communicate air with the vehicle interior to receive cooler air from the vehicle interior and pass heated air to the vehicle interior. However in one example of the disclosure, the cover 152 completely closes the charging device compartment 158, or a separate movable cover is provided that is opened and closed by the user to gain access to the charging device compartment 158. In one example, the movable cover has vents that permit air to communicate with the blower, or the vents in the tray 180 are instead provided in the movable cover and plenums are provided to communicate the air to the cover vents. In addition, one or more vehicle HVAC blowers are provided in the charging device storage area 150 to provide cooled air to the charging device compartment 150.

Still further, the blower need not communicate air through the tray 180 or the moveable cover. Instead, the blower an communicate air to the interior of the dashboard, or directly with the vehicle air conditioning and/or heater blower or plenums. Or, the blower communicates air directly with the vehicle interior through vents provided in the front face of the dashboard. For example, the tray 180 extends downward to form the charging device housing 120 and enclose the charger 114 and blower 116, as well as have a front face with an outer surface that forms a surface of the dashboard that faces the user. One or more vents are provided in that front surface and the blower 116 communicates air directly to/from the vehicle interior (i.e., passenger compartment).

It is further noted that, as shown in FIG. 2, the platform intake vent 186 is provided on the driver side and rear of the platform 181, and the platform exhaust vent 188 is provided toward the passenger side of the platform 181. Thus, a vent or wall 190 is not provided at the front of the platform 181 so that it does not obstruct the user from placing devices on the platform 181 for charging. However, in one example, a vent and/or wall 190 is also provided at all four sides of the platform 181, including the front of the platform 181 to prevent devices placed on the platform 181 from falling forward out of the platform 181. And, vents and/or walls are provided at any suitable locations and more or fewer vents and/or walls can be provided. For example, in one embodiment, vents and/or walls are provided at all four sides of the platform 181, or only at the left and right sides (driver side and passenger side) of the platform 181, and not at the front or rear of the platform 181. And, all walls need not include a vent, but can just provide protection against the devices being charged from inadvertently falling off the platform 181 or out of the tray 180. And the intake vent need not be on the passenger side and the exhaust vent on the driver side, but arranged in other configurations, such as being switched. Though the walls 190 are shown as separate elements positioned at one or more sides of the platform 181, in one example a single contiguous wall is provided about the entire periphery of the platform 181. Still further dividing walls are provided to separate the platform 181 into multiple platforms each holding one device to be charged.

The battery charging apparatus 100, including the charging device storage compartment 158 and the charger compartment 110, is integrally formed as a single unitary piece, such as by molded plastic. It will be recognized in one example, however, that the various components, including the charging device storage compartment 158 and the charger compartment 110, are separate pieces that are coupled together. The entire battery charging apparatus 100 is built-in to the vehicle dashboard, such as above the control panel 22 and between the passenger and the driver. The disclosure shows and describes a battery charging apparatus 100. The disclosure further includes a vehicle dashboard having an integrated battery charging apparatus 100. The disclosure further includes a vehicle having a battery charging apparatus 100 integrated into the vehicle, such as at the vehicle dashboard, though the battery charging apparatus 100 can be integrated at other locations in a vehicle or other non-vehicle device. The battery charging apparatus is configured so that the battery charger housing is sufficiently close to the platform so that the wireless battery charger wirelessly charges the device in the platform.

Figure 6:
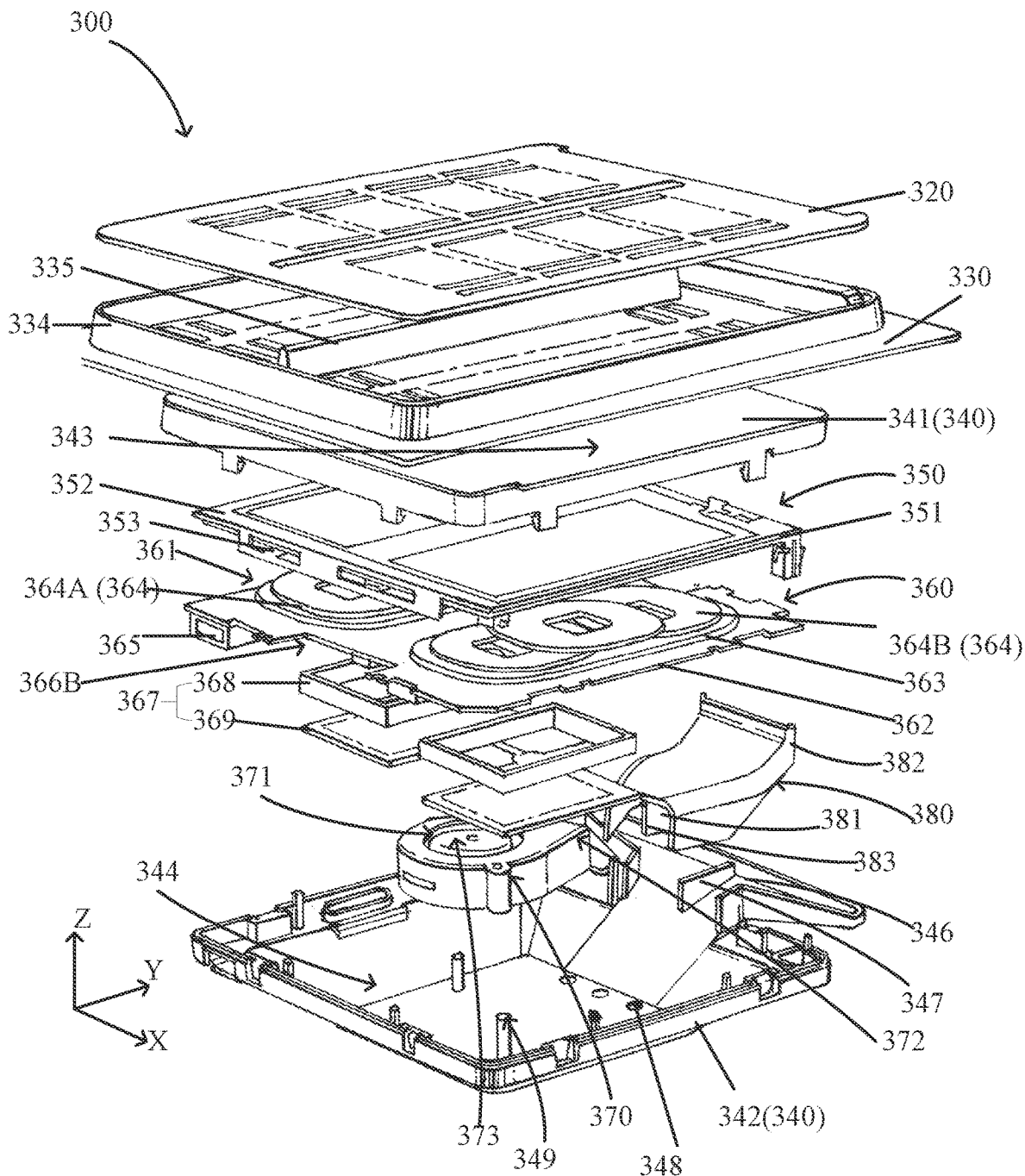
FIG. 6 illustrates an exploded view of another battery charging apparatus for portable-device charging in a vehicle according to one example.
Figure 7:
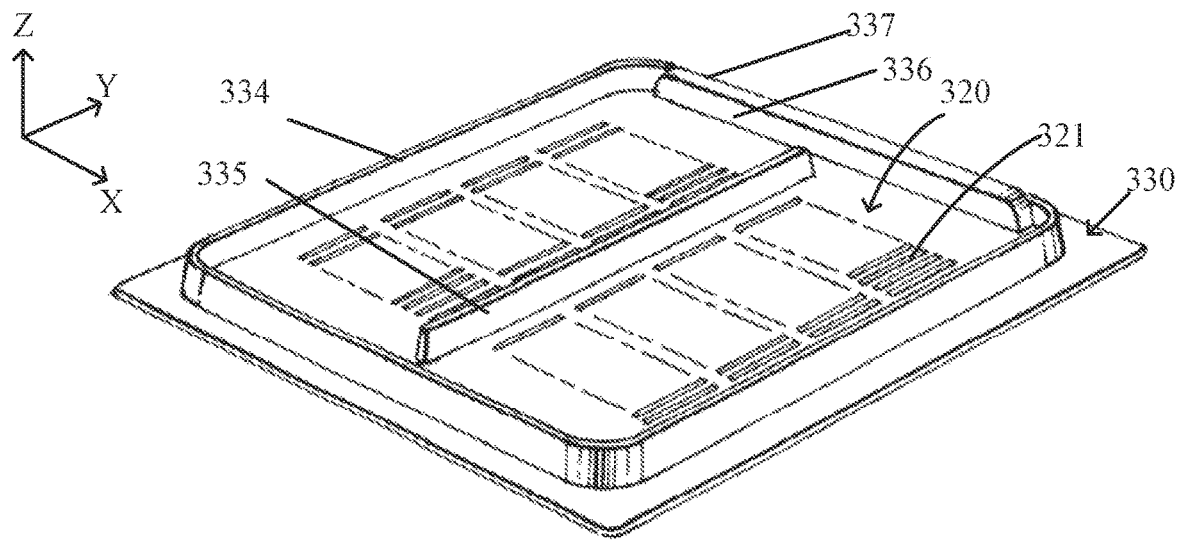
FIG. 7 illustrates a perspective view of a device pad in a charging device compartment of the battery charging apparatus shown in FIG. 6.
Figure 8:
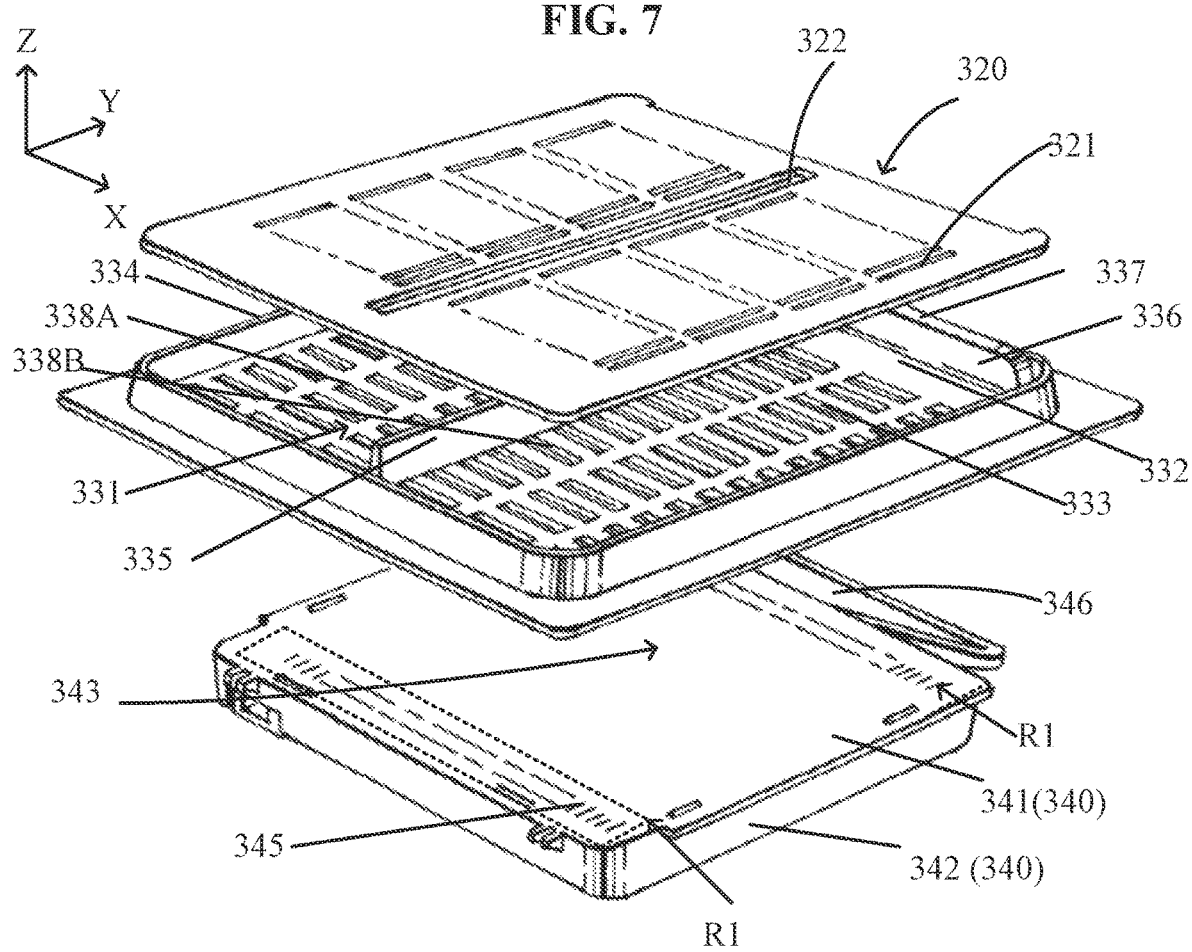
FIG. 8 illustrates a perspective view of a device pad, a charging device compartment, and an assembled housing of the battery charging apparatus shown in FIG. 6.
Figure 9:
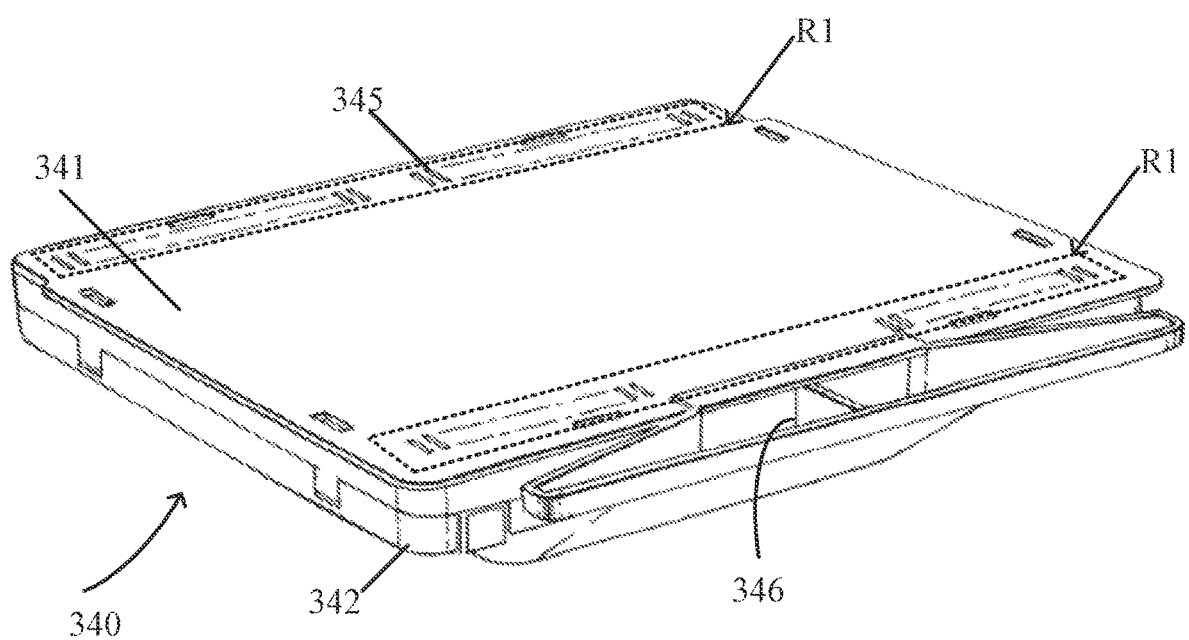
FIG. 9 illustrates a perspective view of the assembled housing of the battery charging apparatus shown in FIG. 6.
Figure 10:
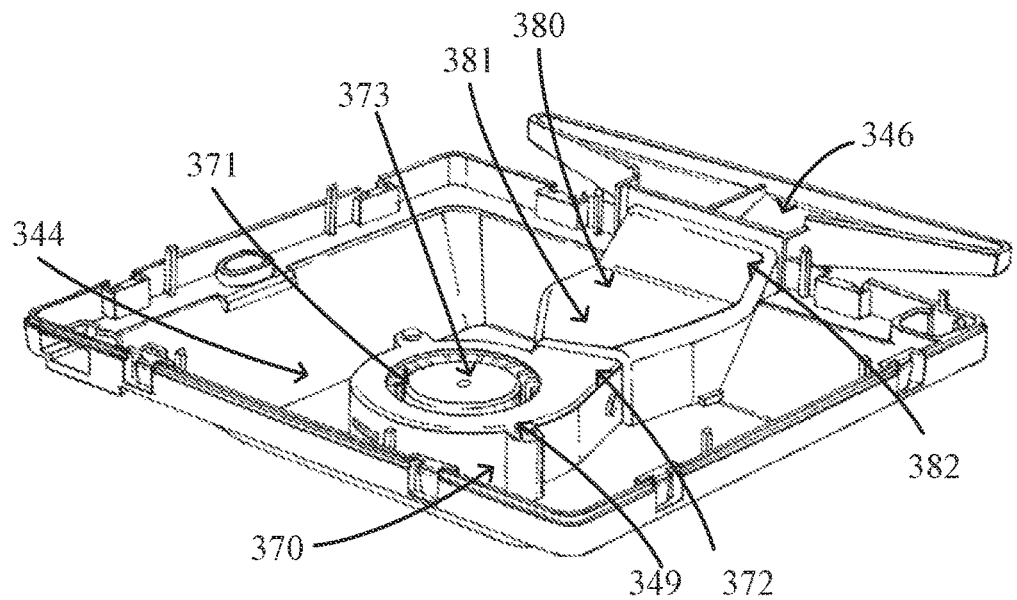
FIG. 10 illustrates a perspective view of a blower and a duct assembled in a bottom member of the housing of the battery charging apparatus shown in FIG. 6.

FIG. 6 illustrates an exploded view of another embodiment of a battery charging apparatus 300 for portable-device charging (such as mobile phone charging) in a vehicle according to one example. FIG. 7 illustrates a perspective view of a device pad in a charging device compartment of the battery charging apparatus 300. FIG. 8 illustrates a perspective view of a device pad, a charging device compartment, and an assembled housing of the battery charging apparatus 300. FIG. 9 illustrates a perspective view of the assembled housing of the battery charging apparatus 300. FIG. 10 illustrates a perspective view of a blower and a duct assembled in a bottom member of the housing of the battery charging apparatus 300. The apparatus 300 includes a pad 320 (such as a phone pad) and a charging device compartment 330 configured to retain at least one portable device. The at least one portable device in the car may include a mobile phone containing a rechargeable battery. In some examples, the at least one portable device can include two mobile phones or other electronic devices with rechargeable batteries. The apparatus 300 further includes a housing 340, an antenna device 350, a battery charger 360, a blower 370, and a plenum or duct 380.

The housing 340 includes a top member 341 and a bottom member 342 configured to be coupled to each other and define an accommodating interior space 344 of the housing 340 between the top member 341 and the bottom member 342. The housing 340 further includes an air-return port 346. The charger 360 is in the housing 340 and is between the top member 341 of the housing 340 and the blower 370. FIG. 6 also shows a coordinate system including X, Y, Z, axes. The X axis is perpendicular to the Y axis, and the X and Y axes define an X-Y plane. The Z axis is perpendicular to the X and Y axes and the X-Y plane. In the example of FIG. 6, the X-Y plane and the X and Y axes are parallel to a surface plane 343 of the top member 341, and the Z axis is perpendicular to the surface plane 343 of the top member 341.

Referring to FIGS. 6, 7 and 8, the pad 320 can be arranged in the charging device compartment 330 and has a first plurality of openings 321. The first plurality of openings 321 may include slits arranged in a 2-dimensional array and each extending along the Y direction. In the example of FIG. 8, the pad 320 has a length along the Y direction and a width along the X direction. The pad 320 further includes a slot 322 located for example in a middle portion of the pad 320 along the width of the pad 320, and the slot 322 extends in parallel to a direction of the length of the pad 320 along Y direction. The first plurality of openings 321 can have other suitable sizes and shapes according to various application scenarios. The pad 320 may be an anti-skid pad configured to support one or more portable devices in the device compartment 330, such that the portable devices on the pad 320 may not skid regardless of the respective vehicle being moving or not.

The charging device compartment 330 includes a tray 331. The tray 331 has a base 332 and has a second plurality of openings 333 extending through the base 332 of the tray 331. Each of the openings 333 includes a slit extending in parallel to the X direction, and perpendicular to extending directions of the slot 322 of the pad 320. Various shapes, sizes, extending directions, and locations of openings (such as 333 and 321) may be chosen according to various application scenarios.

The tray 331 further has one or more walls 334 and a ridge 335 on the base 332. The walls 334 define space for retaining one or more portable devices. In the examples of FIGS. 6 to 8, the ridge 335 divides or separates the space defined or surrounded by the walls 334 into two retaining spaces (e.g., two retaining portions) 338a and 338b, and each of the two retaining spaces can retain a portable device such as a mobile phone. Accordingly, the ridge 335 separates the two retaining spaces (e.g., two retaining portions) of the charging device compartment 330. Each of the two retaining spaces can retain a portable device, and accordingly, two portable devices, such as two mobile phones with two batteries, can be charged together as needed, e.g., either by a single charger 360 or by a separate charger. The single charger 360 may include two groups of charging coils aligned with or corresponding to the first and second retaining portions 338a, 338b, respectively. The ridge 335 can be aligned with and be inserted into the slot 322 of the pad 320, such that the pad 320 can be arranged on and in contact with the base 332 of the tray 331 stably. The blower 370 may be configured to pull air from portable devices situated on the pad 320 in one or both of the portions 338a, 338b, from the charger 360, and/or from the antenna device 350; and may be further configured to push air away or out via the duct 380 and the air-return port 346 of the housing 340.

Referring to FIGS. 6, 8, and 9, the top member 341 of the housing 340 includes a third plurality of openings 345 that extend through the top member 341 or the surface plane 343 of the top member 341, such as at one or more periphery portions of the top member 341. The third plurality of openings 345 may be configured to operate as air inlet openings or vents of the housing 340.

Referring to FIGS. 6, 8, and 9, the charger 360 is between the top member 341 of the housing 340 and the blower 370. In one example, the charger 360 may include or be a wireless charger configured to wirelessly charge batteries of the portable devices retained in the charging device compartment 330. In other examples, the charger 360 may include a wired charger configured to charge batteries of the portable devices retained in the charging device compartment via cables such as universal-serial-bus (USB) cables.

Referring to FIGS. 6 and 10, the blower 370 is in the housing 340 and includes an input port 371, an output port 372, and a fan 373 configured to pull air in from the input port 371 and push air out via the output port 372 to the duct 380 and the air-return port 346. The input port 371 of the blower 370 faces towards the charger 360. The duct 380 has an input port 381 and an output port 382. The input port 381 of the duct 380 is coupled to the output port 372 of the blower 370 so that the input port 381 of the duct 380 is in air flow communication with the output port 372 of the blower 370. And the output port 382 of the duct 380 is coupled to the air-return port 346 of the housing 340 so that the output port 382 of the duct 380 is in air flow communication with the air-return port 346 of the housing 340. The duct 380 is configured to guide air from the output port 372 of the blower 370 to air-return port 346 of the housing 340.

The input port 381 of the duct 380 encloses or surrounds the output port 372 of the blower 370 and is configured to receive air from the output port 372 of the blower 370. The duct 380 can form or operate as a barrier between the accommodating space 344 and the air-return port 346 of the housing 340 when the blower is on, so as to block air in the air-return port 346 from flowing to the accommodating space 344, or reduce the amount of air flowing from the air-return port 346 to the accommodating space 344. Accordingly, efficiency of the blower 370 in driving air from the accommodating space 344 to the air-return port 346 and to an external space of the housing 340 can be improved.

Figure 11:
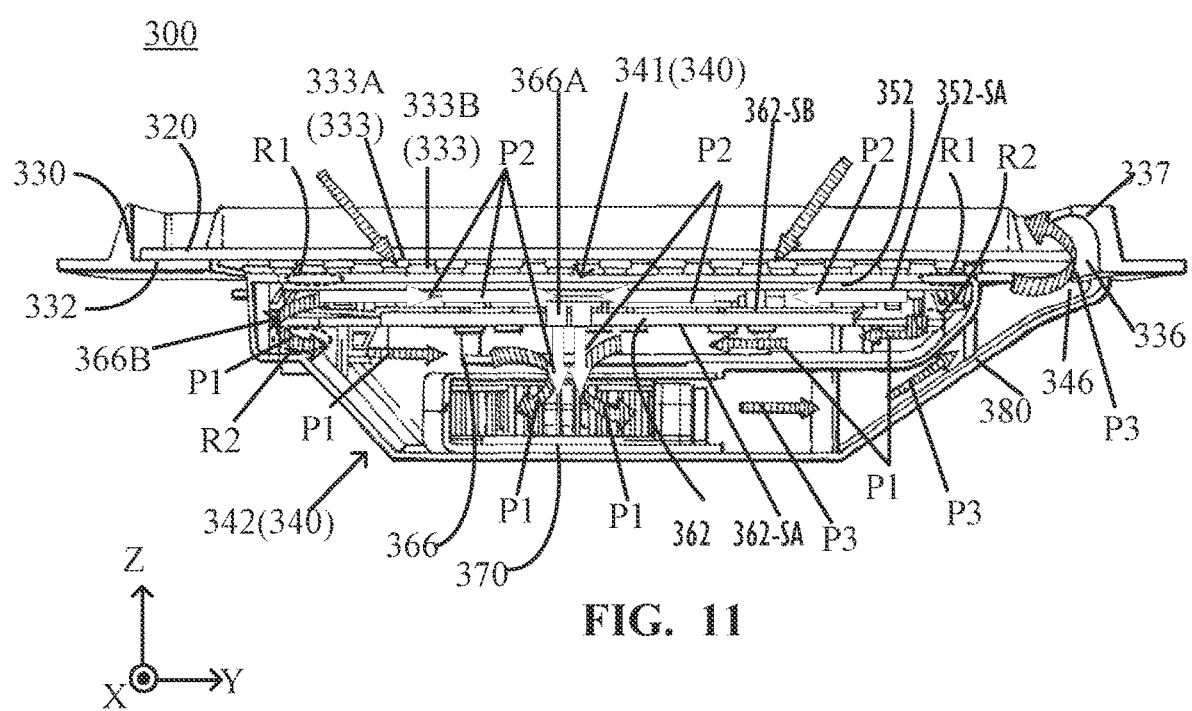
FIG. 11 illustrates a cross-sectional view of the battery charging apparatus of FIG. 6 according to another example.

Referring to FIGS. 7, 8, and 11, the charging device compartment 330 further includes an air-return opening 336 configured to receive return air from the air-return port 346 and an air-directing member 337 with a curved inner surface configured to direct return air from the air-return port 334 of the housing 340 towards the at least one portable device. The air-directing member 337 and the air-return opening 336 are configured to provide recirculated air over the portable devices being charged, which assists in the cooling. Port-air-divider 347 of the air-return port 346 can divide the air-return port 346 into two portions, and duct-air-divider 383 of air duct 380 can divide the air duct 380 into two portions, and the port-air-divider 347 and the duct-air-divider 383 can incorporate or define air direction veins for the housing 340. The forced convection of air across the portable devices can improve the cooling of the portable devices being charge. Additionally, cooler air may be introduced by the vehicle heating and cooling system to further improve cooling of the portable devices, for example a further duct can connect the vehicle cooling system to the accommodating space 344 or the duct 380 to introduce cool air into the duct 380. The air-directing member 337 may be adjacent to or integrated with a wall 334 of the charging device compartment 330.

Referring back to FIG. 6, the charger 360 includes or is a first printed circuit board assembly (PCBA) 361. The first PCBA 361 includes a first printed circuit board (PCB) 362 and at least one group of charge coils 364 on and coupled to the first printed circuit board 362 and configured to charge the at least one portable device in the charging device compartment 330, and one or more coil plates 363. In the example of FIG. 6, the coils 364 may include a first group of charge coils 364a configured to charge a first portable device, and a second group of charge coils 364b configured to charge a second portable device. The first PCBA 361 further includes a connector 365 configured to communicate with the vehicle system and receive power from the vehicle system and provide power to the charger 360, such as a 6-pin input/output connector. The battery charging apparatus 300 further includes one or more electromagnetic-interference (EMI) shields 367 coupled to the first PCBA 361 of the charger 360. The shield 367 includes a frame 368 and a cover 369. The cover 369 may have holes to provide improvement or assistance for system thermal performance, e.g., facilitating dissipation of heat from components of the first PCBA 361 covered by the shield 367. The EMI shields 367 provides EMI shielding to meet EMI requirements and improve EMI shielding for electronic systems, such as electronic components of the first PCBA 361.

The battery charging apparatus 300 further includes an antenna device 350 between the top member 341 of the housing 340 and the charger 360. The antenna device 350 includes a second printed circuit board assembly (PCBA) 351. The antenna device 350 may be configured to communicate with the portable devices such as mobile phones. The second printed circuit board assembly (PCBA) 351 includes a second printed circuit board (PCB) 352 with components attached thereto. The second printed circuit board assembly (PCBA) 351 may include or be provided with an antenna coupler, an EMC grid, a near-field-communication (NFC) antenna, and/or other suitable components.

FIG. 11 illustrates a cross-sectional view of the battery charging apparatus 300 of FIG. 6 according to another example. FIG. 11 shows the assembled battery charging apparatus 300 and air paths of the battery charging apparatus 300. The battery charging apparatus 300 includes or has air paths to guide air flows in response to the blower 370 being turned on. Referring to FIGS. 6-9 and 11, when the blower 370 is on, air (such as cool air from the vehicle compartment which is cool in winter or with the air conditioner of the vehicle on, etc.) may be pulled through the openings 321 of the pad 320 and through the openings 333 of the charging device compartment 330, and may be further pulled into the housing 340 via the openings 345 (not shown in FIG. 11, see FIGS. 8 and 9) in periphery portions (or regions) R1 of the top member 341 of the housing 340.

The battery charging apparatus 300 may further include one or more air paths to pull air (such as cool air from the vehicle compartment which is cool in winter or with the air conditioner of the vehicle on, etc.) to cool the portable devices and the charger 360. In the example embodiment shown, one or more first, second and/or third air paths P1, P2, P3 are shown. The one or more first air paths P1 are positioned in the housing 340. The air paths P1 are formed in the open space or clearance between the bottom of the PCB 362 and the areas around the blower 370 and the top of the duct 380. The first air paths P1 may be configured to, in response to the blower 370 being turned on, guide air from the openings 345 in periphery portions (or regions) R1 of the top member 341 of the housing 340 towards side regions R2 of accommodating space of the housing 340 that is at a vertical level (along Z direction) between the blower 370 and the first printed circuit board (PCB) 362 of the charger 360, and guide air to flow along a first surface (362-SA) of the first PCB 362 of the charger 360 and further flow towards the input port 371 of the blower 370. The second printed circuit board (PCB) 352 has notches at the sides and/or periphery portions of the top of the PCB 352 (e.g., notches 353 shown in FIG. 6), and the first printed circuit board (PCB) 362 has notches 366B in its periphery portions (see FIGS. 6 and 11), such that air can flow from the periphery portions (or regions) R1 of the top member 341 of the housing 340 to side regions R2 of accommodating space of the housing 340. Accordingly, air cooling of the first printed circuit board 362 and the first printed circuit board assembly (PCBA) 361 may be improved. The first surface (362-SA) of the first PCB 362 faces toward the blower 370.

In some examples, the battery charging apparatus 300 may further include one or more second air paths (P2) in the housing 340. The second air paths P2 are formed in the open space or clearance between the top of the first PCB 362 and the bottom of the second PCB 352. The second air paths (P2) may be configured to, in response to the blower 370 being turned on, guide air to flow from the openings 345 in periphery portions (or regions) R1 of the top member 341 of the housing 340 into the housings 340, and guide air (e.g., laterally) along a second surface (362-SB) of the first PCB 362 of the charger 360 toward an inner portion (such as a central portion) of the housing 340, and guide air (e.g., vertically) towards the input port 371 of the blower 370 via one or more slots 366A penetrating the first PCB 362 of the charger 360. The second surface (362-SB) of the first PCBA 361 of the charger 360 faces away from or is opposite with respect to the blower 370.

In some examples, the battery charging apparatus 300 may further include an antenna device 350 between the top member 341 of the housing 340 and the charger 360; and the second air paths (P2) may be configured to, in response to the blower 370 being turned on, guide air to flow (e.g., laterally) between a second surface (362-SB) of the first PCB 362 of the charger 360 and a first surface (352-SA) of the second PCB 352 of the antenna device 350; and guide air (e.g., vertically) towards the input port (371) of the blower 370 via one or more slots (366A) penetrating or extending through the first PCB 362 of the charger. The second surface (362-SB) of the first PCBA 361 of the charger 360 and first surface (352-SA) of the second PCB 352 of the antenna device 350 face towards each other.

In certain examples, the battery charging apparatus 300 may further include a third air path (P3) in the housing 340. The third air path (P3) may be configured to, in response to the blower 370 being turned on, guide air from the output port 372 of the blower 370 towards the air-return opening 336 of the charging device compartment 330 via the duct 380 and the air-return port 346 of the housing 340, and guide circulated or recirculated air from the air-return opening 336 of the charging device compartment 330 towards the one or more portable devices with the curved air-directing member 337 and further to the external space of the battery charging apparatus 300. The circulated or recirculated air guided (or directed) to flow over the portable devices being charged provides forced convection cooling to the portable devices, and accordingly cooling performance is improved according to thermal analysis. Air is circulated from fan of the blower 370 back over top of the portable devices to create a more turbulent air flow over and around the portable devices that further assists in cooling the portable devices. Air exiting the air-return port 346 and the air-return opening 336 mixes with the ambient air in the vehicle compartment, and flows over and around the portable devices to cool the portable devices.

In another example, the air-directing member 337 may be configured to have a different shape to guide air from the air-return opening 336 of the charging device compartment 330 directly towards the external space of the battery charging apparatus 300 without having to flow towards the one or more portable devices. In another embodiment, the air-directing member 337 can be integral with said duct 380. The above-described air paths (such as P1, P2, P3) are merely for illustrative purposes and are not intended to limit the scope of the present disclosure. The battery charging apparatus 300 may include other suitable paths according to various application scenarios. The various components and housings of the charger 360 are not airtight, and accordingly air is pulled through and around the electronic components that generate heat during use, such as for example the coils 364 and the shields 367.

In the example of FIG. 11, the openings 333 of the charging device compartment 330 each may include a first partial-depth opening 333a that extend a fraction of thickness of the base 332 from a top surface the of base 332 of the charging device compartment 330 into the base 332, and a second partial-depth opening 333b that extend another fraction of thickness of the base 332 from a bottom surface of base 332 of the charging device compartment 330 into the base 332, so as to be coupled to the first partial-depth opening 333a and thus allow air to flow through the opening 333 of the base 332. The first partial-depth opening 333a may have a lateral offset (e.g., along X direction) with respect to the second partial-depth opening 333b, and accordingly a lateral overlap width (e.g., along X direction) of the first partial-depth opening 333a and the second partial-depth opening 333b may be reduced, so as to reduce the risk of undesired foreign items passing through the opening 333 of the base 332 and entering the housing 340. In another example, the openings 333 of the charging device compartment 330 may each include a slit penetrating through the depth of the base 332 along Z direction without having the lateral offset between the first partial-depth opening 333a and the second partial-depth opening 333b. Various parameters such as sizes and shapes of the openings 333 of the charging device compartment 330 can be chosen according to actual application scenarios.

Referring back to FIGS. 6, 9, and 10, the top member 341 of the housing 340 includes a third plurality of openings 345 arranged at one or more periphery portions of the top member 341, and includes a solid portion in the middle portion of the top member 341. Accordingly, any liquids (e.g., due to condensation) such as water, are directed through the third plurality of openings 345 and reach the bottom of the accommodating space (344), e.g., via, notches at sides of the second PCB 352 and notches 366B in the periphery portions of the first printed circuit board (PCB) 362. Thus, any fluid is prevented from interfering with the operation of the charger 360. The bottom member 342 of the housing (340) further includes exit holes 348 that allow condensation or water to exit to, e.g., a reservoir of the vehicle.

The bottom member 342 of the housing (340) further includes pegs 349, and the blower 370 is mounted to the pegs 349 and attached to the bottom member 342. The blower 370 may be arranged or positioned, such that the input port (371) of the blower 370 faces towards the space or clearance between two (EMI) shields 367, so as to improve performance of drawing air through the components of the charger 360. There is clearance between the top of the blower 370 and the bottom of the shields 367.

The battery charging apparatus 300 can further include or be provided with a sensor and/or a processing device to turn the blower 370 ON and OFF as needed, e.g., depending on the temperature inside the housing 340. For example, the sensor detects the temperature inside the housing 340 or the temperature of the charger 360, and turn ON the blower 370 when the sensed temperature exceeds a threshold value.

In addition, as noted above, the system and method of the present disclosure can optionally include operation by one or more processing devices, such as to control when to turn the blower ON and OFF, and the blower level (high, low). It is noted that the processing device can be any suitable device, such as a computer, microprocessor, or vehicle control system. Or, the processing device can be controlled remotely such as on a smartphone, tablet, or the like. The processing devices can be used in combination with other suitable components, such as a display device (monitor, LED screen, digital screen, etc.), memory or storage device, input device (touchscreen, keyboard, pointing device such as a mouse), wireless module (for RF, Bluetooth, infrared, WiFi, etc.). The information may be stored on a computer medium such as a computer hard drive, on a CD ROM disk or on any other appropriate data storage device, which can be located at or in communication with the processing device. The entire process is conducted automatically by the processing device, and without any manual interaction. Accordingly, unless indicated otherwise the process can occur substantially in real-time without any delays or manual action.

The operation of the processing device(s) is implemented by computer software that permits the accessing of data from an electronic information source. The software and the information in accordance with the disclosure may be within a single, free-standing computer or it may be in a central computer networked to a group of other computers or other electronic devices. The information may be stored on a computer hard drive, on a CD ROM disk or on any other appropriate data storage device. The system can also be implemented on the cloud and comprise a cloud computing system which provide access via the Internet to shared computing resources, such as servers, storage devices, networks, and/or applications on demand or in real time without regard to the location of those resources.

It will be apparent to those skilled in the art having the benefit of the teachings presented in the foregoing descriptions and the associated drawings that modifications, combinations, sub-combinations, and variations can be made without departing from the spirit or scope of this disclosure. Likewise, the various examples described may be used individually or in combination with other examples. Those skilled in the art will appreciate various combinations of examples not specifically described or illustrated herein that are still within the scope of this disclosure. In this respect, it is to be understood that the disclosure is not limited to the specific examples set forth and the examples of the disclosure are intended to be illustrative, not limiting.

As used in this specification and the appended claims, the singular forms "a", "an" and "the" include plural referents, unless the context clearly dictates otherwise. Similarly, the adjective "another," when used to introduce an element, is intended to mean one or more elements. The terms "comprising," "including," "having" and similar terms are intended to be inclusive such that there may be additional elements other than the listed elements.

Additionally, where a method described above or a method claim below does not explicitly require an order to be followed by its steps or an order is otherwise not required based on the description or claim language, it is not intended that any particular order be inferred. Likewise, where a method claim below does not explicitly recite a step mentioned in the description above, it should not be assumed that the step is required by the claim.

It is noted that the description and claims may use geometric or relational terms, such as cuboid, rectangular cuboid, flush, ergonomic, pyramid, curved, elongated, opposite, transverse, flat, vertical, lateral, horizontal, periphery, upward, raised, top, bottom, left, right, up, down, inner, and outer. These terms are not intended to limit the disclosure and, in general, are used for convenience to facilitate the description based on the examples shown in the figures. In addition, the geometric or relational terms may not be exact. For instance, walls may not be exactly perpendicular or parallel to one another because of, for example, roughness of surfaces, tolerances allowed in manufacturing, etc., but may still be considered to be perpendicular or parallel.

The foregoing description and drawings should be considered as illustrative only of the principles of the disclosure, which may be configured in a variety of shapes and sizes and is not intended to be limited by the embodiment herein described. Numerous applications of the disclosure will readily occur to those skilled in the art. Therefore, it is not desired to limit the disclosure to the specific examples disclosed or the exact construction and operation shown and described. Rather, all suitable modifications and equivalents may be resorted to, falling within the scope of the disclosure.

The invention claimed is:

1. A battery charging apparatus for device charging in a vehicle, said apparatus comprising:
   a charging device compartment configured to retain at least one device;
   a housing including a top member, a bottom member, and an accommodating space between the top member and the bottom member, wherein the housing further includes an air-return port;
   a blower in the housing and having an input port and an output port;
   a charger in the housing and between the top member of the housing and the blower; and
   a duct having an input port and an output port, the input port of the duct being coupled to the output port of the blower, and the output port of the duct being coupled to the air-return port of the housing,
   wherein the duct forms a barrier between the accommodating space and the air-return port of the housing.

2. The battery charging apparatus of claim 1, further comprising a pad in the charging device compartment and having a first plurality of openings.

3. The battery charging apparatus of claim 2, wherein the first plurality of openings include slits.

4. The battery charging apparatus of claim 2, wherein:
   the at least one device in the car includes a phone containing a battery; and
   the pad is an anti-skid pad configured to support the phone in the device compartment.

5. The battery charging apparatus of claim 1, wherein the charging device compartment includes a tray having a second plurality of openings.

6. The battery charging apparatus of claim 1, wherein the top member includes a third plurality of openings at one or more periphery portions of the top member.

7. The battery charging apparatus of claim 6, wherein the third plurality of openings at one or more periphery portions of the top member configured to operate as air inlet openings of the housing.

8. The battery charging apparatus of claim 1, wherein the charger is a wireless charger.

9. The battery charging apparatus of claim 1, wherein the input port of the blower faces towards the charger.

10. The battery charging apparatus of claim 1, wherein:
    the input port of the duct encloses the output port of the blower and is configured to receive air from the output port of the blower.

11. The battery charging apparatus of claim 1, wherein:
    the charger includes a first printed circuit board assembly (PCBA); and
    the first PCBA includes a printed circuit board and at least one group of charge coils coupled to the first printed circuit board and configured to charge the at least one device in the vehicle.

12. The battery charging apparatus of claim 11, wherein the first printed circuit board has one or more slots penetrating the first printed circuit board.

13. The battery charging apparatus of claim 1, further comprising:
    an antenna device between the top member of the housing and the charger, wherein the antenna device includes a second printed circuit board assembly.

14. The battery charging apparatus of claim 1, further comprising:
    a first air path in the housing and configured to, in response to the blower being on:

guide air to flow along a first surface of a first printed circuit board of the charger and towards the input port of the blower, the first surface facing toward the blower.

15. The battery charging apparatus of claim 1, further comprising:
a second air path in the housing and configured to, in response to the blower being on:
guide air to flow along a second surface of the first printed circuit board of the charger, wherein the second surface of the first printed circuit board of the charger faces away from the blower; and
guide air towards the input port of the blower via one or more slots penetrating the first printed circuit board of the charger.

16. The battery charging apparatus of claim 1, further comprising:
an antenna device between the top member of the housing and the charger, wherein the antenna device includes a second printed circuit board; and
a second air path in the housing and configured to, in response to the blower being on:
guide air to flow between a second surface of the first printed circuit board of the charger and a first surface of the second printed circuit board of the antenna device, the second surface of the first printed circuit board of the charger and the first surface of the second printed circuit board of the antenna device face towards each other; and
guide air towards the input port of the blower via one or more slots penetrating the first PCB of the charger.

17. A battery charging apparatus for device charging in a vehicle, said apparatus comprising:
a charging device compartment including two portions configured to retain two devices respectively;
a housing including a top member, a bottom member, and an accommodating space between the top member and the bottom member, wherein the housing further includes an air-return port;
a blower in the housing and having an input port and an output port,
a charger in the housing and between the top member of the housing and the blower, wherein the charger includes two groups of charge coils for charging the two devices respectively; and
a duct having an input port and an output port, the input port of the duct being coupled to the output port of the blower, and the output port of the duct being coupled to the air-return port of the housing,
wherein the duct forms a barrier between the accommodating space and the air-return port of the housing, and the blower is configured to pull air from at least one of the two devices and from the charger and to push air away via the duct and the air-return port of the housing.

18. The battery charging apparatus of claim 17, wherein the charging device compartment includes a ridge that separates the two portions of the charging device compartment.

19. The battery charging apparatus of claim 17, further comprising:
a first air path in the housing and configured to, in response to the blower being on:
guide air to flow along a first surface of a first printed circuit board of the charger and towards the input port of the blower, the first surface facing toward the blower.

20. A battery charging apparatus for device charging in a vehicle, said apparatus comprising:
a pad having a first plurality of openings;
a charging device compartment including two portions configured to retain two phones respectively, wherein the charging device compartment includes a tray having a second plurality of openings, and the pad is in the tray of the charging device compartment;
a housing including a top member, a bottom member, and an accommodating space between the top member and the bottom member, wherein the top member of the housing includes a third plurality of openings at one or more periphery portions of the top member and the housing further includes an air-return port;
a blower in the housing and having an input port and an output port,
a wireless charger in the housing and between the top member of the housing and the blower, wherein the charger includes two groups of charge coils for charging the two devices respectively; and
a duct having an input port and an output port, the input port of the duct being coupled to the output port of the blower, and the output port of the duct being coupled to the air-return port of the housing,
wherein the duct forms a barrier between the accommodating space and the air-return port of the housing, and the blower is configured to pull air from at least one of the two phones and from the wireless charger and to push air away via the duct and the air-return port of the housing.

21. A wireless battery charging apparatus for a vehicle, said apparatus comprising:
a tray with a plurality of tray openings;
a pad positioned on top of the tray, said pad having a plurality of pad openings, said pad receiving a device having a battery to be charged;
a housing coupled to said tray;
a wireless battery charger enclosed inside said housing;
a blower inside said housing and aligned with said wireless battery charger and having an outlet port, said blower pulling air through said tray openings, said pad openings, and through said wireless battery charger to the outlet port; and
a duct attached to the outlet port of said blower and having and exhaust, said duct directing air from the outlet port of said blower to said pad to provide air circulation about the pad.

22. The wireless battery charging apparatus of claim 21, wherein air from the exhaust mixes with ambient air and flows around a device received at said pad.

* * * * *